United States Patent
Lee et al.

(10) Patent No.: US 9,437,614 B1
(45) Date of Patent: Sep. 6, 2016

(54) DUAL-SEMICONDUCTOR COMPLEMENTARY METAL-OXIDE-SEMICONDUCTOR DEVICE

(71) Applicant: International Business Machines Corporation, Armonk, NY (US)

(72) Inventors: Sanghoon Lee, White Plains, NY (US); Effendi Leobandung, Stormville, NY (US); Renee T. Mo, Yorktown Heights, NY (US); Yanning Sun, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/858,964

(22) Filed: Sep. 18, 2015

(51) Int. Cl.
| | | |
|---|---|---|
| *H01L 29/66* | (2006.01) | |
| *H01L 27/12* | (2006.01) | |
| *H01L 29/06* | (2006.01) | |
| *H01L 29/20* | (2006.01) | |
| *H01L 27/092* | (2006.01) | |
| *H01L 21/3213* | (2006.01) | |
| *H01L 21/84* | (2006.01) | |
| *H01L 29/04* | (2006.01) | |
| *H01L 21/3105* | (2006.01) | |
| *H01L 21/762* | (2006.01) | |
| *H01L 21/321* | (2006.01) | |
| *H01L 29/10* | (2006.01) | |
| *H01L 29/16* | (2006.01) | |
| *H01L 29/165* | (2006.01) | |

(52) U.S. Cl.
CPC ..... *H01L 27/1207* (2013.01); *H01L 21/31051* (2013.01); *H01L 21/32115* (2013.01); *H01L 21/32134* (2013.01); *H01L 21/32136* (2013.01); *H01L 21/76224* (2013.01); *H01L 21/845* (2013.01); *H01L 27/0924* (2013.01); *H01L 29/04* (2013.01); *H01L 29/0649* (2013.01); *H01L 29/0676* (2013.01); *H01L 29/20* (2013.01); *H01L 29/1054* (2013.01); *H01L 29/165* (2013.01); *H01L 29/1608* (2013.01)

(58) Field of Classification Search
CPC ................. H01L 29/1054; H01L 29/66795; H01L 29/1608; H01L 29/66553; H01L 29/165; H01L 29/16; H01L 29/785; H01L 21/02381; H01L 21/02505; H01L 29/2003; H01L 29/7787
USPC .......... 257/192, 66, 206, 401, E21.112, 190, 257/E21.431, 347; 438/149, 151, 478, 689
See application file for complete search history.

(56) References Cited

U.S. PATENT DOCUMENTS 7,928,427 B1  4/2011  Chang
8,084,337 B2  12/2011  Samuelson et al.
(Continued)

FOREIGN PATENT DOCUMENTS

TW        201347176 A    11/2013

*Primary Examiner* — Thinh T Nguyen
(74) *Attorney, Agent, or Firm* — Louis J. Percello, Esq.; Otterstedt, Ellenbogen & Kammer, LLP

(57) ABSTRACT

A method of forming an active device on a semiconductor wafer includes the steps of: forming a plurality of semiconductor fins on at least a portion of a semiconductor substrate; forming a dielectric layer on at least a portion of the semiconductor substrate, the dielectric layer filling gaps between adjacent fins; forming a plurality of gate structures on an upper surface of the dielectric layer; forming a channel region on the dielectric layer and under at least a portion of the gate structures, the channel region comprising a first crystalline semiconductor material; forming source and drain epitaxy regions on an upper surface of the dielectric layer and between adjacent gate structures, the source and rain regions being spaced laterally from one another; and replacing the channel region with a second crystalline semiconductor material after high-temperature processing used in fabricating the active device has been completed.

7 Claims, 16 Drawing Sheets

(56) References Cited

U.S. PATENT DOCUMENTS

| | | |
|---|---|---|
| 8,148,218 B2 | 4/2012 | Chang |
| 8,785,226 B2 | 7/2014 | Lee et al. |
| 8,962,453 B2 | 2/2015 | Wunnicke et al. |
| 2003/0102497 A1* | 6/2003 | Fried ................ H01L 29/66795 257/255 |
| 2014/0264362 A1 | 9/2014 | Wang et al. |
| 2014/0329376 A1 | 11/2014 | Sanchez et al. |
| 2015/0076620 A1 | 3/2015 | Waldron et al. |

* cited by examiner

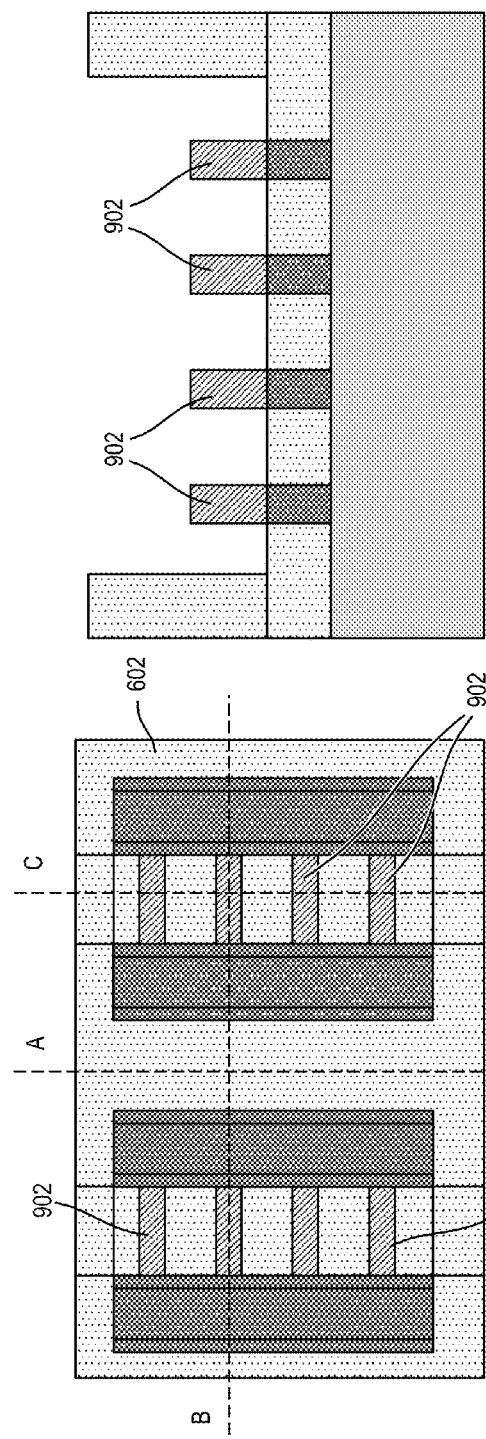
FIG. 9A
FIG. 9B
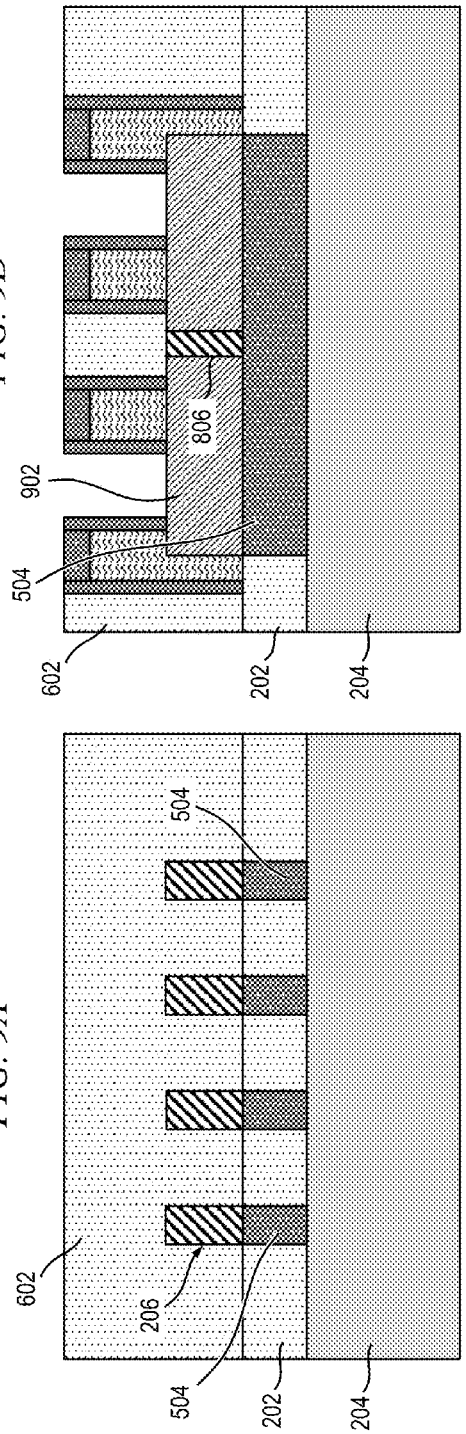
FIG. 9D
FIG. 9C

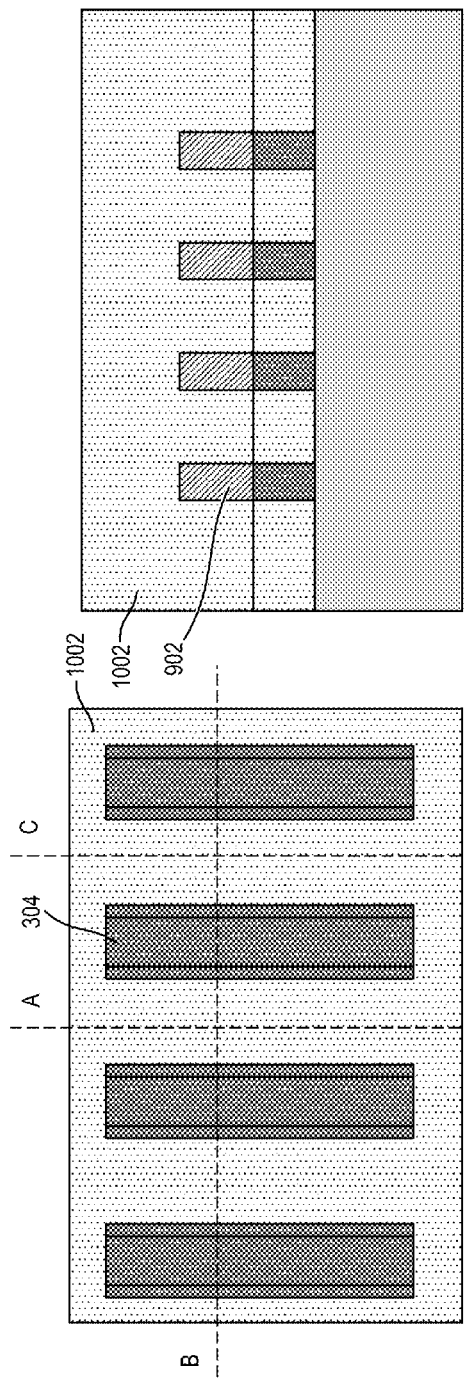
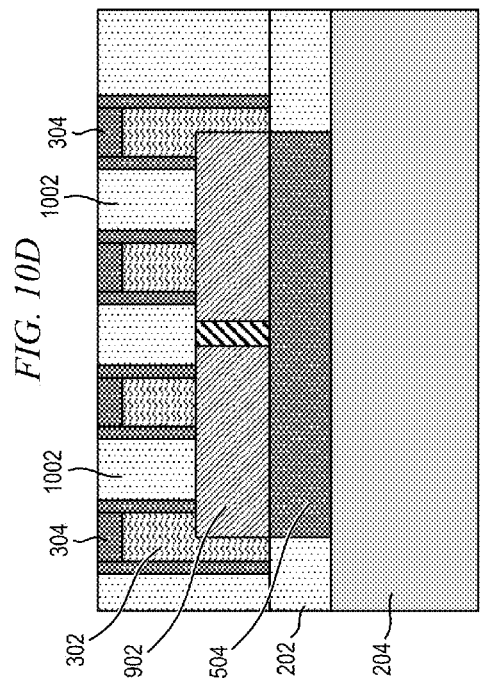
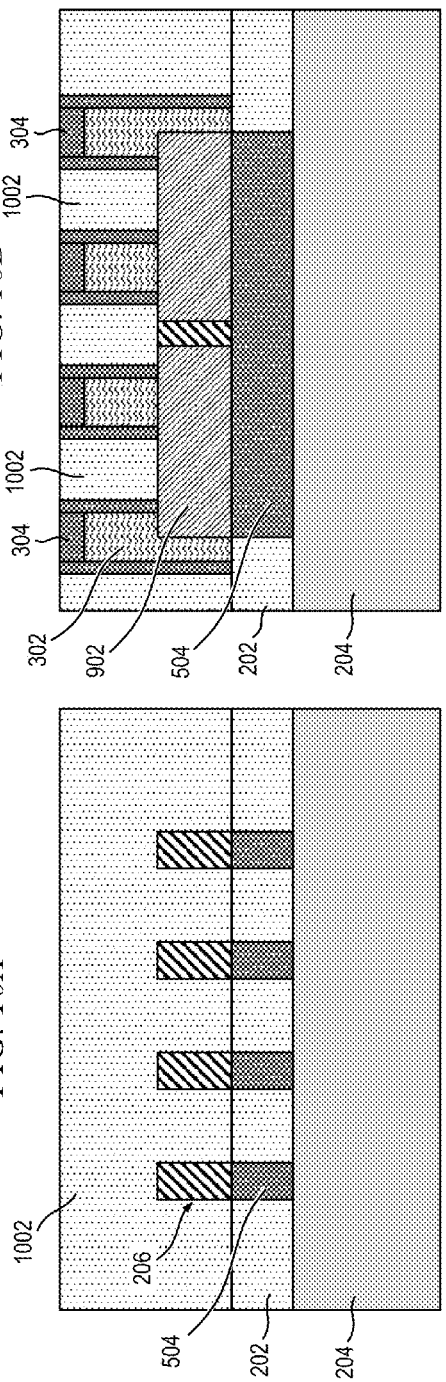

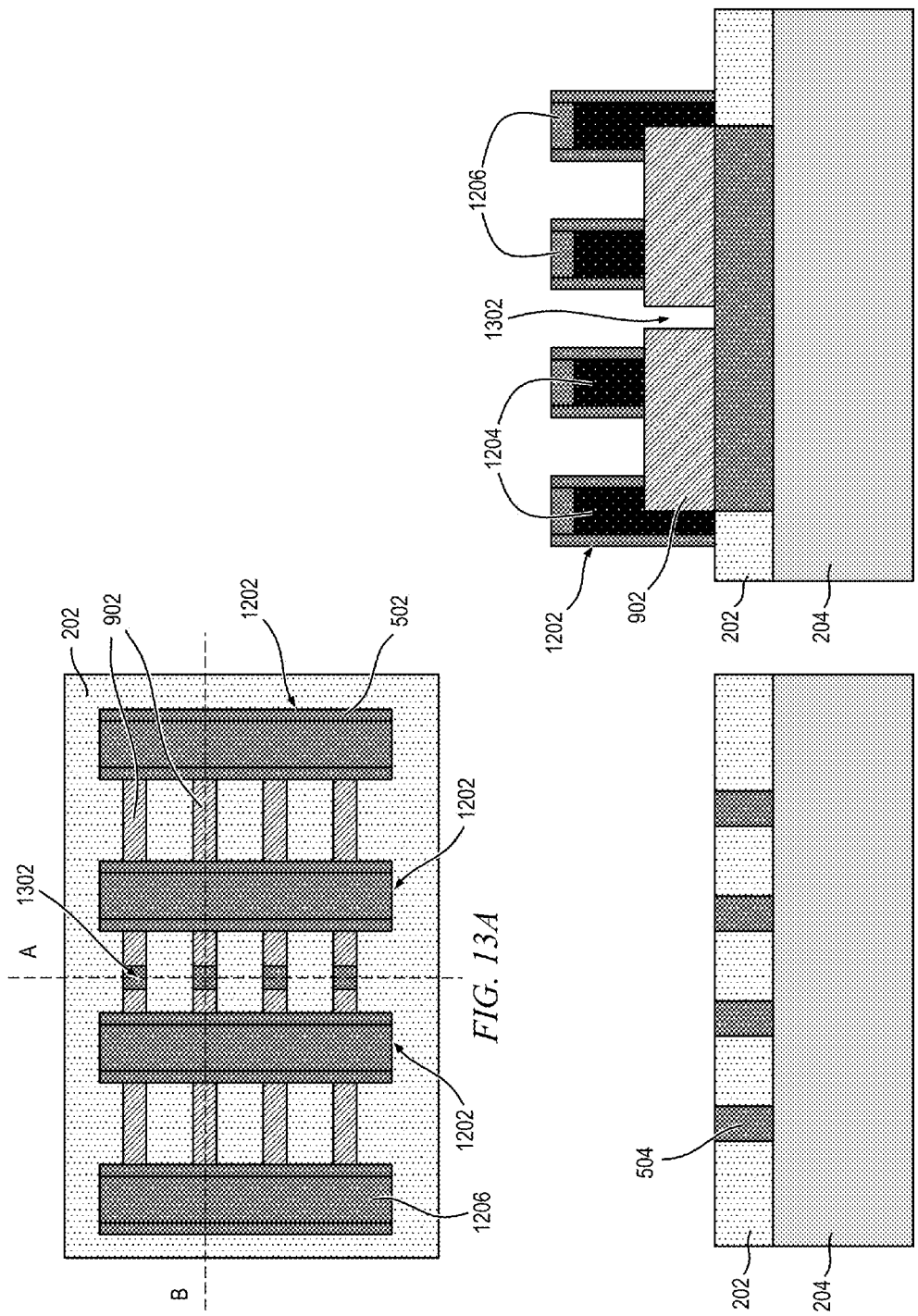

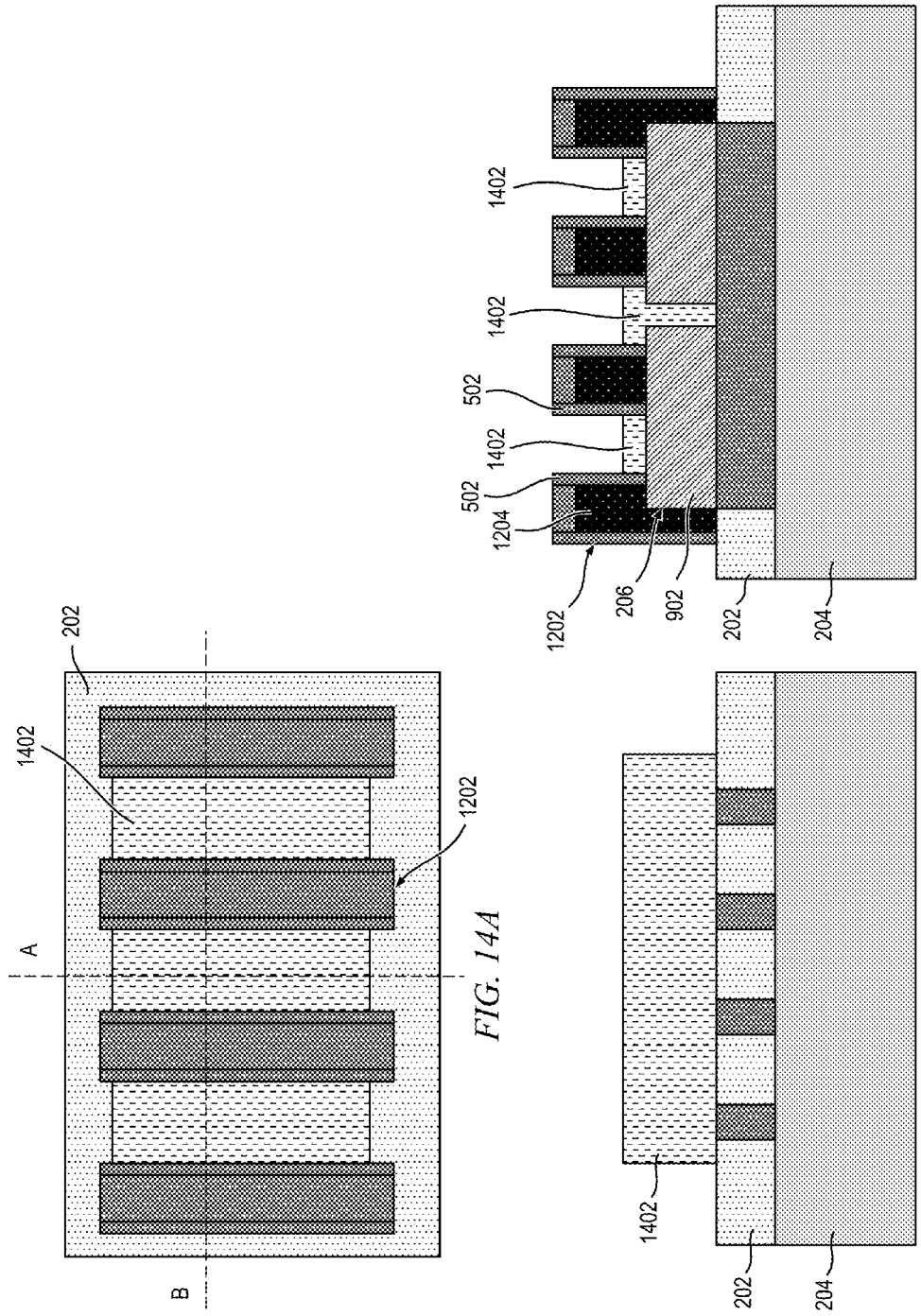

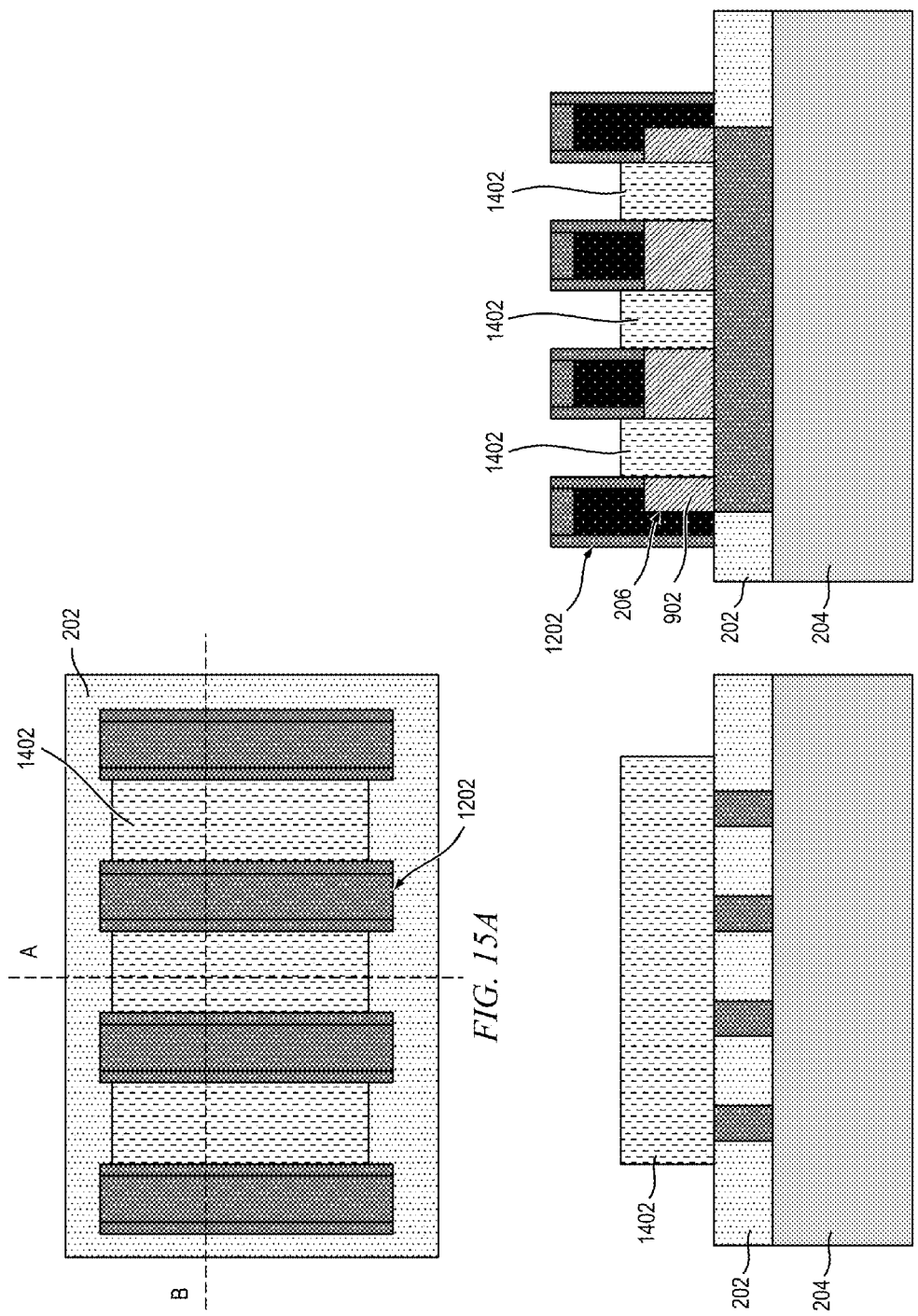

DUAL-SEMICONDUCTOR COMPLEMENTARY METAL-OXIDE-SEMICONDUCTOR DEVICE

BACKGROUND

The present invention relates generally to the electrical, electronic and computer arts, and, more particularly, to semiconductor structures and methods of forming same.

A nanowire is a structure having a diameter on the order of a nanometer and having a very small dimension in the nanometer regime. Many different types of nanowires exist, including superconducting, metallic, semiconducting, insulating, and molecular. There are many applications where nanowires may be utilized in electronic, opto-electronic and nanoelectromechanical devices, such as, for example, as additives in advanced composites, as metallic conductors in nanoscale quantum devices, and as detection elements in electrochemical biosensors, among other applications.

It is known that nanowires on group III-V materials can be grown on silicon, <111> or another crystal orientation, opening perpendicular to a seed opening. There are two standard approaches to synthesizing nanowires: top-down and bottom-up. A top-down approach involves using patterning and lithography to reduce a larger piece of material to smaller structures, whereas a bottom-up approach synthesizes the nanowire by combining constituent adatoms (atoms adsorbed on a surface so that they will migrate over the surface).

In fabricating metal-oxide-semiconductor field-effect transistor (MOSFET) devices, it is known to use Group III-V materials, rather than silicon, to form a channel in the device. (See, e.g., U.S. Pat. No. 7,928,427 to Chang, the disclosure of which is hereby incorporated by reference herein in its entirety.) Unfortunately, however, conventional methods of forming III-V channels limit the ability to employ high-temperature process steps in the device fabrication.

SUMMARY

One or more embodiments of the invention provide a technique for fabricating a semiconductor structure including an active semiconductor device having a channel comprising a Group III-V or other crystalline semiconductor material formed on a silicon substrate. It is to be appreciated that embodiments of the invention are not limited to Group III-V materials but rather can be comprised of other semiconductor materials including, but not limited to, Group IV, Group II-VI, or other crystalline semiconductor materials such as, for example, carbon or graphene. Moreover, the channel is formed after a replacement gate process and/or other high-temperature process steps used in fabricating active semiconductor devices on the substrate have been completed. In this manner, aspects of the invention beneficially eliminate the restrictions on high-temperature processing that are associated with conventional III-V channel fabrication methodologies.

In one aspect, an exemplary method of forming an active device on a semiconductor wafer includes the steps of: forming a plurality of semiconductor fins on at least a portion of a semiconductor substrate; forming a dielectric layer on at least a portion of the semiconductor substrate, the dielectric layer filling gaps between adjacent fins; forming a plurality of gate structures on an upper surface of the dielectric layer; forming a channel region on the dielectric layer and under at least a portion of the gate structures, the channel region comprising a first crystalline semiconductor material; forming source and drain epitaxy regions on an upper surface of the dielectric layer and between adjacent gate structures, the source and rain regions being spaced laterally from one another; and replacing the channel region with a second crystalline semiconductor material after high-temperature processing used in fabricating the active device has been completed.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. By way of example only and without limitation, one or more embodiments may provide one or more of the following advantages, among other benefits:

The formation of a nanowire in an active semiconductor device channel that is defect-free.

The formation of a Group III-V channel after high-temperature processing, thereby allowing other high temperature steps in the fabrication of the semiconductor device to proceed as normal and reduce defects in the channel.

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

The following drawings are presented by way of example only and without limitation, wherein like reference numerals (when used) indicate corresponding elements throughout the several views, and wherein:

FIGS. 2A through 16C are top plan and corresponding cross-sectional views depicting intermediate processing steps in an overall semiconductor fabrication methodology for forming an active semiconductor device comprising a dual semiconductor material structure, according to one or more embodiments of the invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative methods and apparatus for fabricating a silicon-based P-type field-effect transistor (PFET) device and/or an N-type field-effect transistor (NFET) device having a channel comprising a crystalline semiconductor nanowire formed on a substrate. Moreover, the III-V nanowire channel is formed after high-temperature process steps used in fabricating the silicon-based PFET and/or NFET devices have been completed, so as to beneficially eliminate restrictions on high-temperature processing associated with conventional III-V channel fabrication methodologies. It is to be appreciated, however, that the invention is not limited to the specific methods and/or apparatus illustratively shown and described herein. Rather, aspects of the present disclosure relate more broadly to techniques for forming an active semiconductor device comprising a dual semiconductor material structure on a silicon substrate after high-temperature processing used in fabricating the active semiconductor device has been completed. Moreover, it will become apparent to those skilled in the art given the teachings herein that numerous modifications can be made to the embodiments shown that are within the scope of the claimed invention. That is, no limitations with respect to the embodiments shown and described herein are intended or should be inferred.

Figure 1:
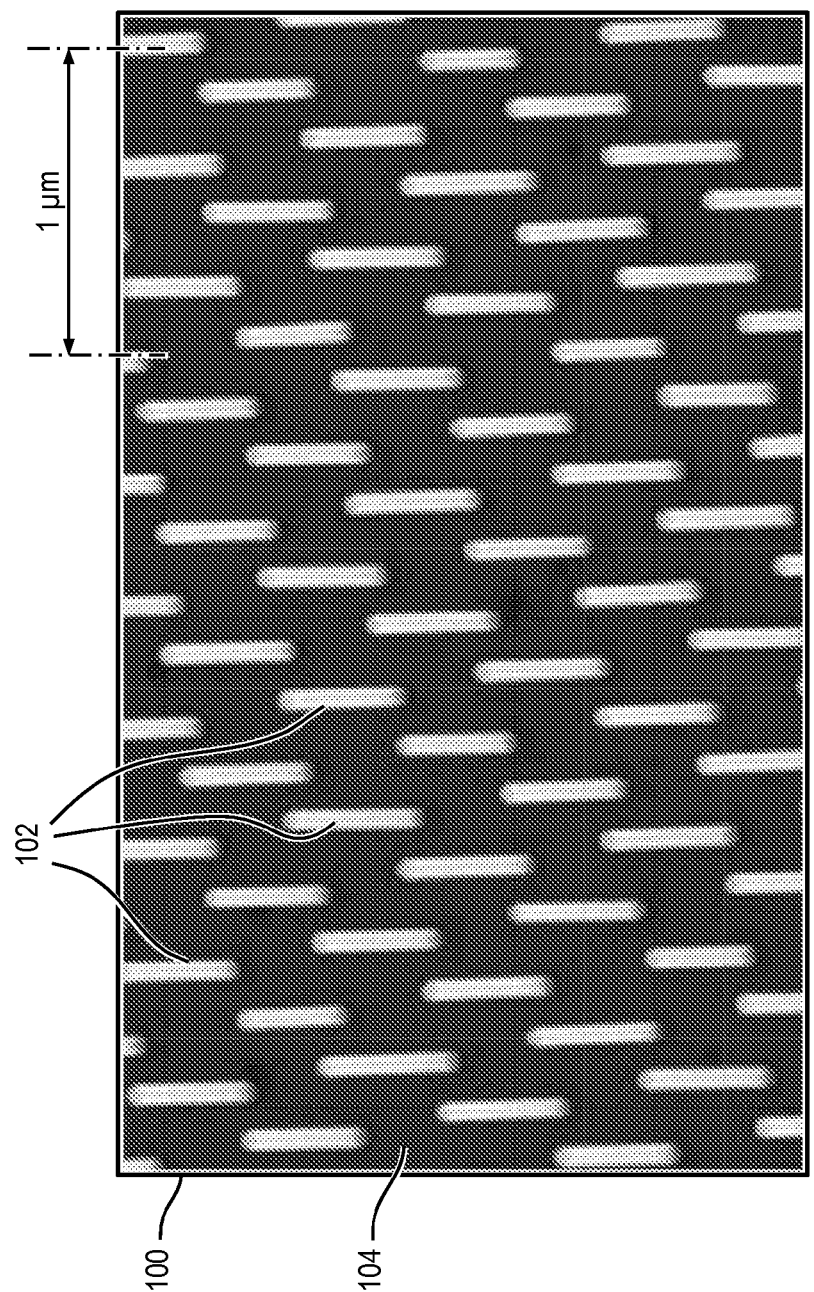
FIG. 1 is a scanning electron micrograph (SEM) image depicting epitaxial nanowire hetero structures grown on a silicon substrate 104.

One or more embodiments the present disclosure involve a method of forming an active semiconductor device (e.g., PFET, NFET, FinFET, nanowire, stack nanowire, etc.). Rather than employing a standard silicon channel in the active device, one or more embodiments utilize a Group III-V nanowire grown on a silicon substrate. FIG. 1 is a scanning electron micrograph (SEM) image 100 depicting epitaxial nanowire heterostructures 102 grown on a silicon substrate 104. In accordance with one method, organometallic precursors are fed into a reactor which will react and epitaxially grow a nanowire on the substrate. Although Group III-V nanowires can be grown on a silicon substrate having a <111> crystal orientation, other orientations are similarly contemplated by one or more embodiments of the invention.

If the Group III-V nanowire channel is formed before the completion of all high-temperature process steps on a wafer used in fabricating the semiconductor device, then subjecting the wafer to elevated temperatures will undesirably cause the Group III-V materials to diffuse into the surrounding source and drain regions formed in an epitaxial region of the device. Furthermore, the Group III-V materials will likely dissociate upon the application of high temperature steps, which will destroy the material. Thus, as previously stated, the formation of the nanowire channel prior to the completion of high-temperature processing steps will place significant restrictions on the range of temperatures to which the wafer can be subsequently subjected.

One or more embodiments of the invention generally provide processes to selectively and epitaxially deposit Group III-V-containing materials on monocrystalline surfaces of a substrate during fabrication of electronic devices. By way of example only and without limitation, FIGS. 2A-16C are top plan and corresponding cross-sectional views depicting intermediate processing steps/stages in a fabrication method for forming an active semiconductor structure, and, more specifically, for forming Group III-V nanowire channel NFET and PFET devices, according to an embodiment of the invention. It is to be appreciated that the channel material is not restricted to Group III-V materials but rather can be formed of other semiconductor materials, including, but not limited to, Group IV, Group II-VI, or other crystalline semiconductor materials such as, for example, carbon or graphene.

Although the overall fabrication method and structures formed thereby are entirely novel, certain individual processing steps required to implement a portion or portions of the method may utilize conventional semiconductor fabrication techniques and conventional semiconductor fabrication tooling. These techniques and tooling will already be familiar to one having ordinary skill in the relevant arts given the teachings herein. Moreover, many of the processing steps and tooling used to fabricate semiconductor devices are also described in a number of readily available publications, including, for example: P. H. Holloway et al., *Handbook of Compound Semiconductors: Growth, Processing, Characterization, and Devices*, Cambridge University Press, 2008; and R. K. Willardson et al., *Processing and Properties of Compound Semiconductors*, Academic Press, 2001, which are hereby incorporated by reference herein. It is emphasized that while some individual processing steps are set forth herein, those steps are merely illustrative and one skilled in the art may be familiar with several equally suitable alternatives that would also fall within the scope of the invention.

It is to be understood that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Figure 2A:
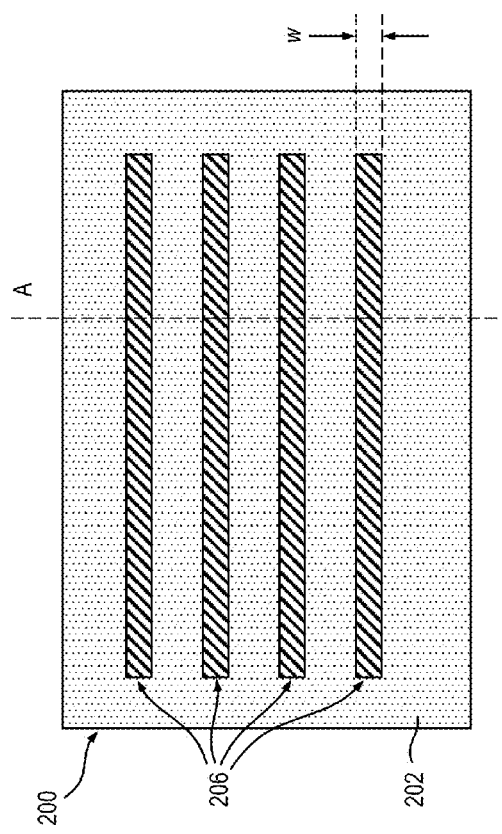
Figure 2B:
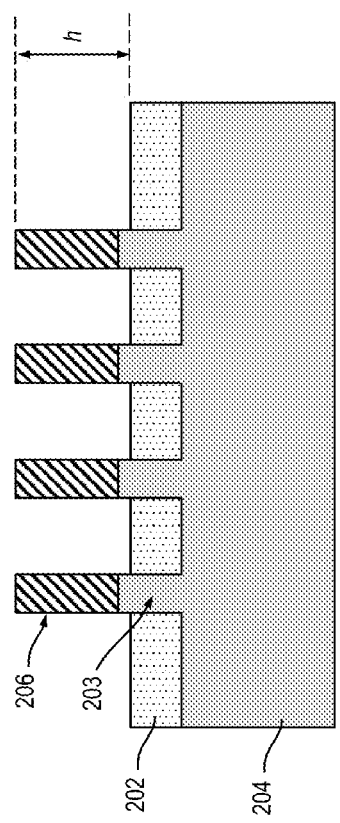

FIG. 2A is a top plan view depicting at least a portion of a wafer 200 on which one or more embodiments of the invention are implemented; FIG. 2B is a corresponding cross-sectional view of the wafer 200 taken at line A in FIG. 2A. With reference to FIGS. 2A and 2B, an exemplary fin formation process is illustrated. Specifically, a substrate 204 is first patterned using, for example, a standard optical lithography process, to form a plurality of base fin structures 203 on at least a portion of an upper surface of the substrate. As will be known by those skilled in the art, a standard optical lithography process involves using light to transfer a geometric pattern from a photomask to a light-sensitive chemical photoresist (or "resist") deposited on at least a portion of an upper surface of the substrate 204 to thereby form a hardmask. The exposure to light causes a chemical change that allows some of the photoresist to be removed by a special solution, called "developer." An etch step is then performed, wherein the wafer 200 is subjected to a liquid ("wet") or plasma ("dry") chemical agent (i.e., etchant) to remove an uppermost portion of the substrate 204 in areas that are not protected by photoresist. Although the base fin structures 203 are shown as being evenly spaced and substantially parallel to one another, embodiments of the invention are not restricted to any particular arrangement of the fin structures.

The substrate 204 is commonly formed of single-crystal (bulk) silicon (e.g., having a <100> or <111> crystal orientation), although suitable alternative materials may also be used, such as, but not limited to, germanium, silicon germanium, silicon carbide, gallium arsenide, gallium nitride, or the like. Additionally, in one or more embodiments the substrate 204 may be modified by adding an impurity or dopant (e.g., boron, phosphorous, arsenic, etc.) to change a conductivity of the material (e.g., N-type or P-type). In one or more embodiments, the substrate 204 is of N-type conductivity and may thus be referred to as an N⁻ substrate. An N⁻ substrate may be formed by adding an N-type impurity or dopant (e.g., Group V elements, such as phosphorous) of a prescribed concentration level (e.g., about $5 \times 10^{16}$ to about $5 \times 10^{19}$ per cubic centimeter) to the substrate material, such as by using a diffusion or implant step, to change the conductivity of the material as desired. In one or more alternative embodiments, a P⁺ substrate may be formed by adding a P-type impurity or dopant (e.g., Group III elements, such as boron) of a prescribed concentration level to the substrate material.

A plurality of semiconductor fins 206 are formed on the bulk silicon base fin structures 203. The fins 206, in one or more embodiments, may be formed using a silicon growth process, so that the material forming the fins 206 is essentially homogeneous with the substrate 204. Alternatively, in one or more embodiments, a material different than the bulk silicon substrate 204 is deposited on an upper surface of the base fin structures 203 using a deposition process (e.g., chemical vapor deposition (CVD) or metal-organic CVD (MOCVD)). For example, a suitable material which can be used to form the fins 206 comprises germanium.

A dielectric layer 202, such as a shallow trench isolation (STI) layer or the like, is formed on at least a portion of an upper surface of a semiconductor substrate 204. STI is typically used to isolate active devices formed on the same substrate. Dielectric layer 202, in one or more embodiments, is formed of an insulating material, such as, for example, an oxide (e.g., silicon dioxide), a nitride (e.g., silicon nitride), or the like, that is deposited over the upper surface of the wafer 200, filling the regions outside the fins 206, including the gaps between fins. In one or more embodiments, an oxide or nitride deposition is performed using, for example, CVD. The dielectric layer 202 is then planarized with an upper surface of the fins 206 (e.g., using chemical-mechanical polishing (CMP) or the like) and recessed (e.g., using an etching step) to expose the fins 206. STI is well known by those skilled in the art, and therefore the specific details of the STI process flow will not be included herein for economy of description.

In one or more embodiments, each of at least a subset of the fins 206 is formed having a height, h, above an upper surface of the dielectric layer 202 of about 50 nanometers (nm) and a width, w, of about 3 to 10 nm. It is to be understood, however, that the invention is not limited to any particular materials and/or dimensions for the fins 206.

Figure 3A:
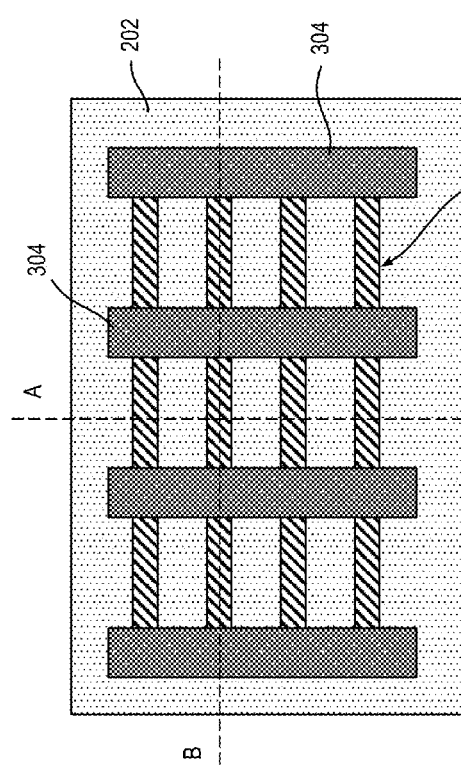
Figure 3C:
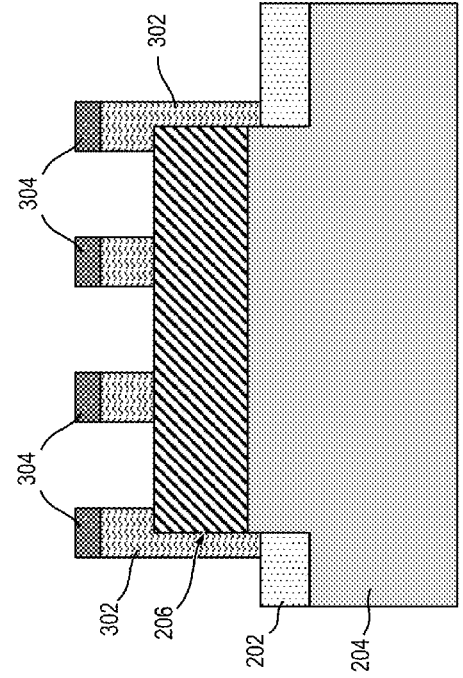
Figure 3B:
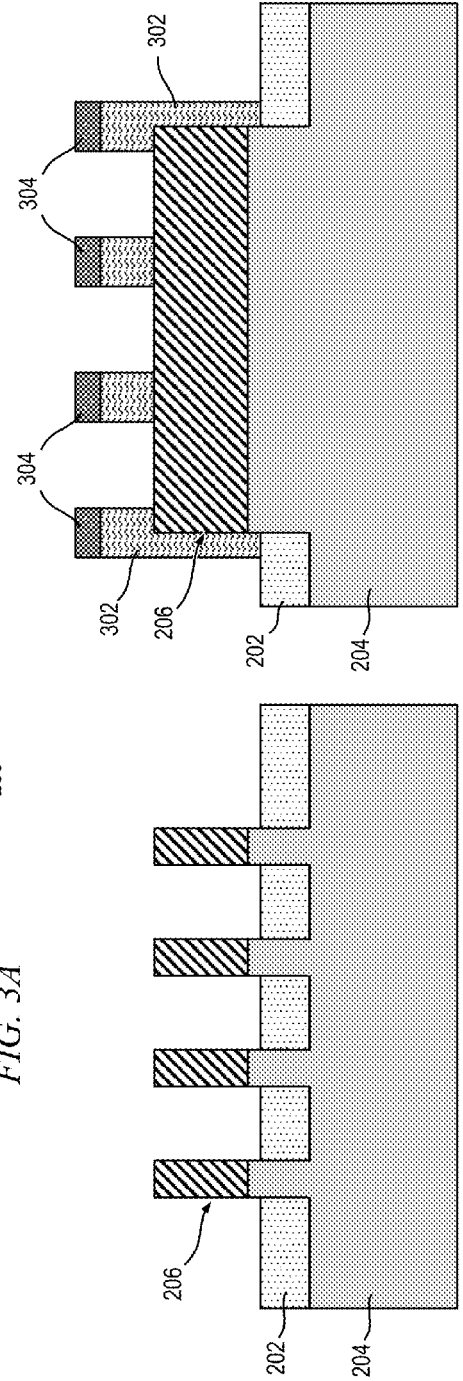

A plurality of dummy gates 302 are formed over at least a portion of the fins 206, as shown in FIGS. 3A-3C. FIG. 3A is a top plan view of the structure including the dummy gates 302; FIGS. 3B and 3C are corresponding cross-sectional views taken at lines A and B, respectively, in FIG. 3A. The dummy gates 302 essentially serve as placeholders for corresponding real gates that will be subsequently formed, as described in further detail herein below. In one or more embodiments, the dummy gates 302 are formed of amorphous silicon, although embodiments of the invention are not limited to amorphous silicon material. For example, at least a subset of the dummy gates 302 can, in one or more embodiments, be formed of silicon oxide, silicon nitride, or other materials that can be later removed. A hardmask layer 304 is formed on an upper surface of the dummy gates 302. The hardmask layer 304, in one or more embodiments, is formed of a nitride (e.g., silicon nitride) about 20 to 30 nm in thickness, although it is to be appreciated that the invention is not limited to any specific material or thickness of the hardmask layer. Although not explicitly shown in FIGS. 3A-3C, a thin gate oxide layer (e.g., 2 nm), or alternative insulating layer, is formed under the dummy gates 302 so as to electrically isolate the dummy gates from the underlying epitaxial layer 202. The gate oxide layer can also be used to protect the fin during dummy layer patterning and removal.

Figure 4A:
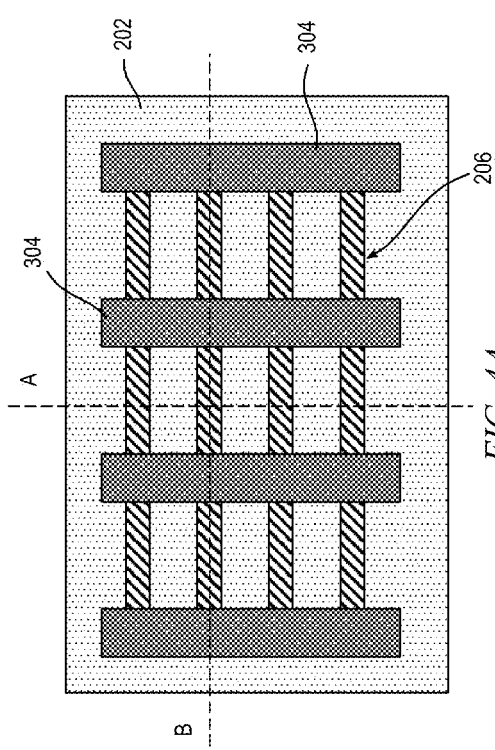
Figure 4C:
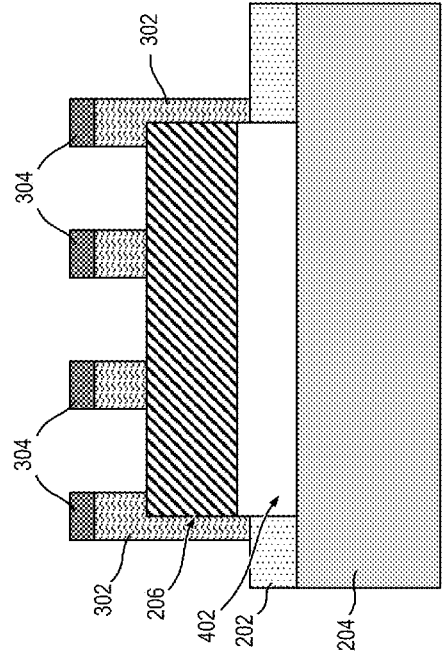
Figure 4B:
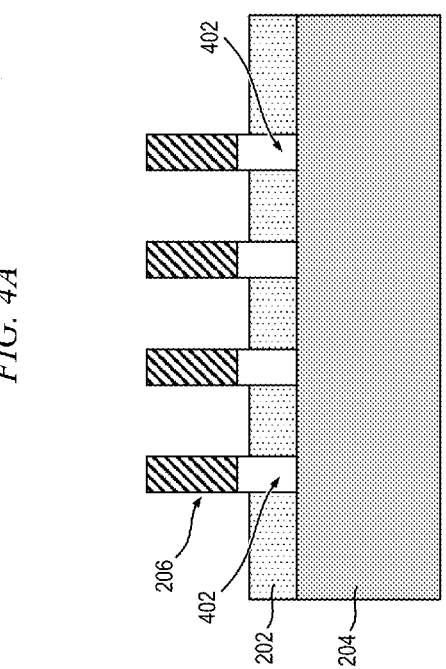

With reference now to FIGS. 4A-4C, an etch is performed; FIG. 4A is a top plan view and FIGS. 4B and 4C are corresponding cross-sectional views taken at lines A and B, respectively, in FIG. 4A. The etch is preferably an isotropic etch, typically a wet etch, selective to the fins 206, so that corresponding voids 402 are formed under an upper portion of each of at least a subset of the fins, as depicted in FIGS. 4B-4C.

Figures 5A, 5B, 5C:
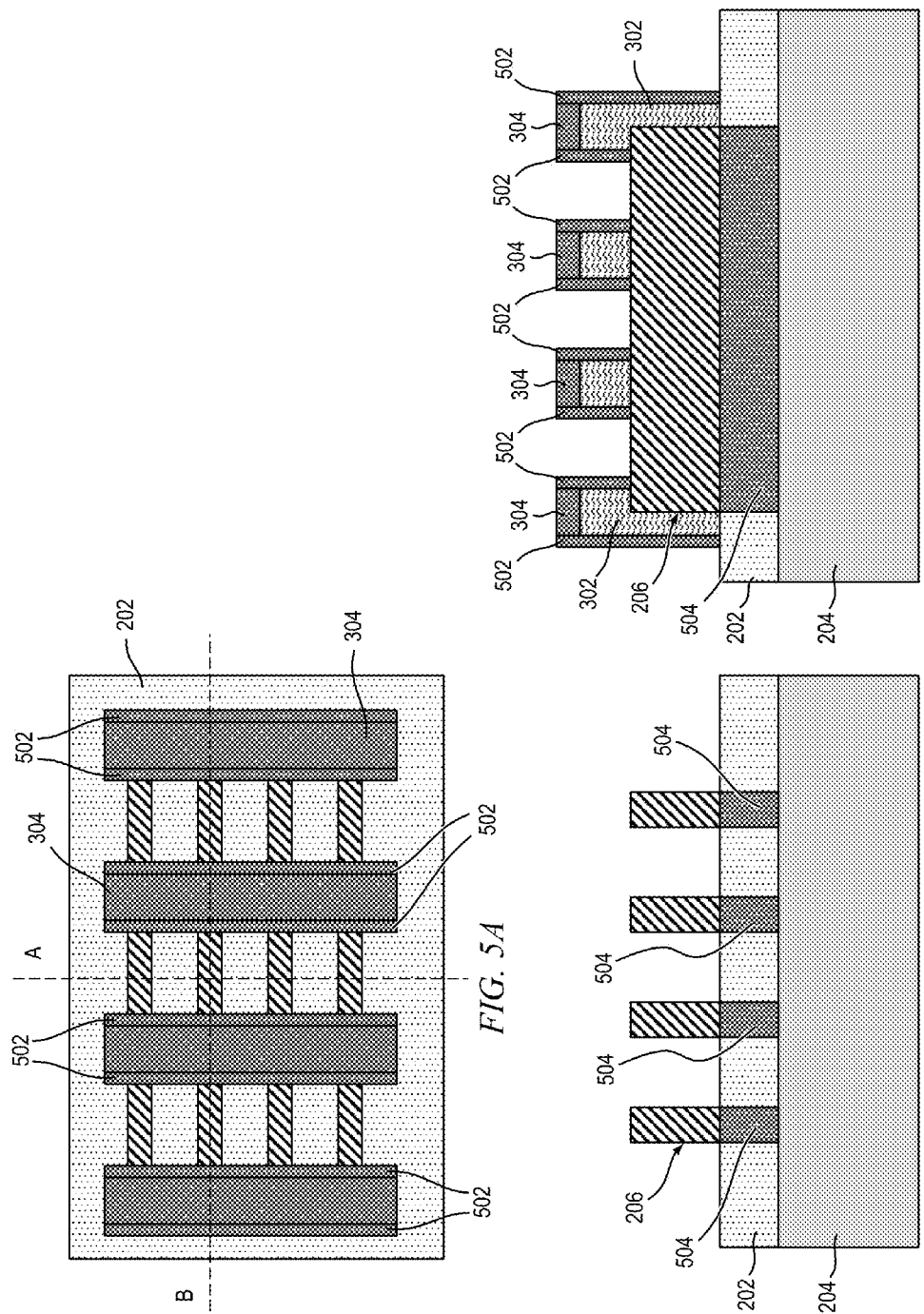

Next, insulating spacers 502 are formed, such as by a deposition process, on at least a portion of sidewalls of the dummy gates 302 of the devices, as shown in FIGS. 5A-5C; FIG. 5A is a top plan view and FIGS. 5B and 5C are corresponding cross-sectional views taken at lines A and B, respectively, in FIG. 5A. In one or more embodiments, the spacers 502 are comprised of a thin conformal dielectric material, such as, for example, nitride or oxide. Because the deposited spacer material is conformal, it will adhere to the sidewalls of the dummy gates 302, the sidewalls of the fins 206, as well as the horizontal surfaces of the wafer. The spacer material will also fill the voids (402) formed in the prior etching step, to thereby form dielectric regions 504 under the fins 206. A subsequent etch is performed to remove the spacer material on any exposed horizontal surfaces as well as the spacer material on the sidewalls of the fins 206. After the etch, spacer material will preferably only remain on the sidewalls of the gates (i.e., spacers 502) and under the fins (i.e., dielectric regions 504), in one or more embodiments.

For devices such as, for example, PFET devices or high-voltage devices, which do not comprise Group III-V material, all high-temperature processing is first completed, including, for example, source and drain epitaxy and anneal steps, as will be known by those skilled in the art.

Figure 6A:
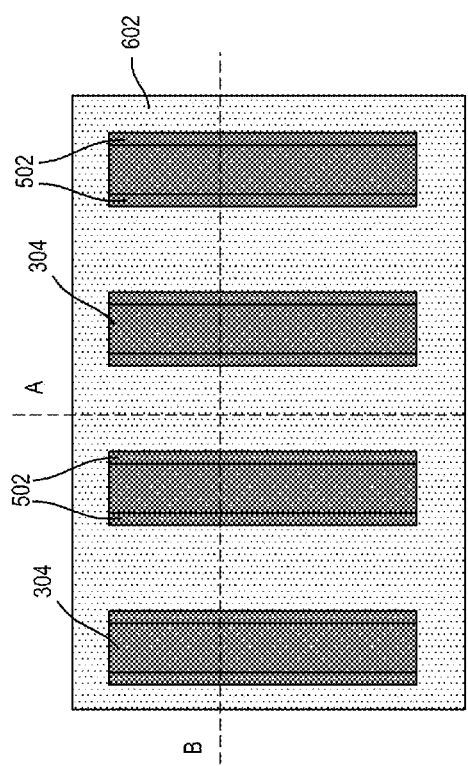
Figure 6C:
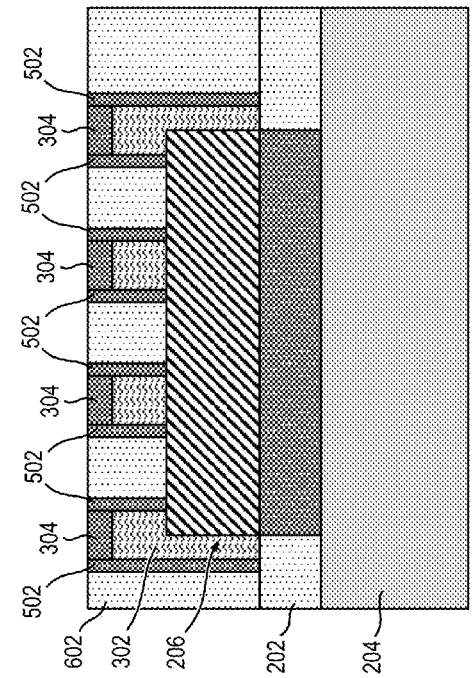
Figure 6B:
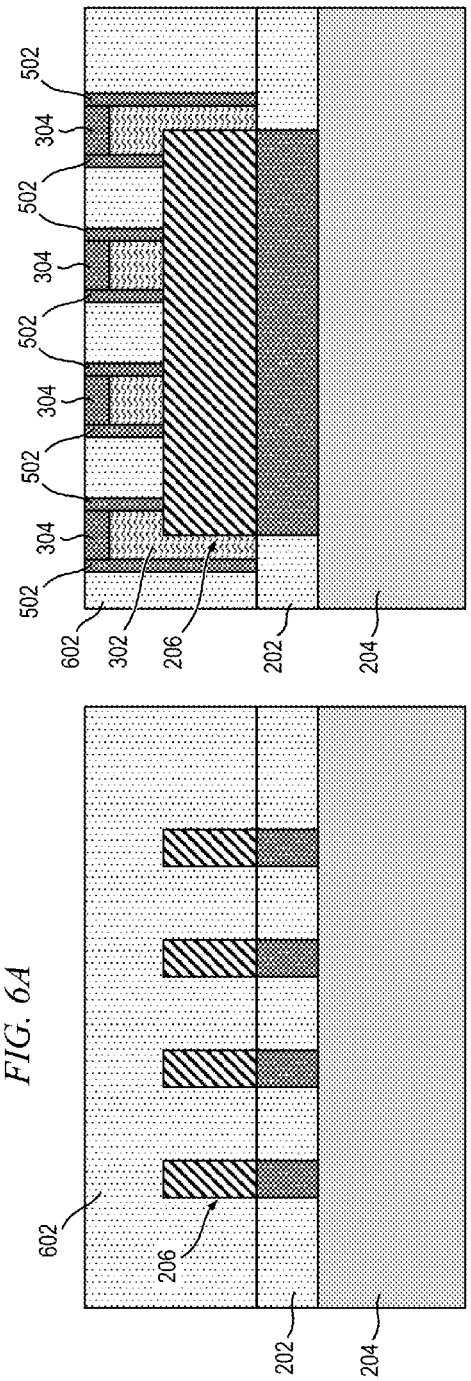

FIGS. 6A-6C depict the formation of a dielectric layer 602 over at least a portion of an upper surface of the wafer; FIG. 6A is a top plan view and FIGS. 6B and 6C are corresponding cross-sectional views taken at lines A and B, respectively, in FIG. 6A. In one or more embodiments, the dielectric layer 602 may comprise a low-temperature oxide (e.g., less than about 400 degrees Celsius (° C.)), such as, for example, silicon dioxide, or an oxide/nitride combination formed by an oxidation process. The dielectric layer 602 is then planarized to the upper surface of the dummy gates 302, such as by using a polishing step (e.g., chemical mechanical polishing/planarization (CMP), chemical etching, etc.) so that the dielectric layer 602 is substantially planar with an upper surface of the sidewall spacers 502 and the hardmask layer 304 formed on the dummy gates.

Figure 7C:
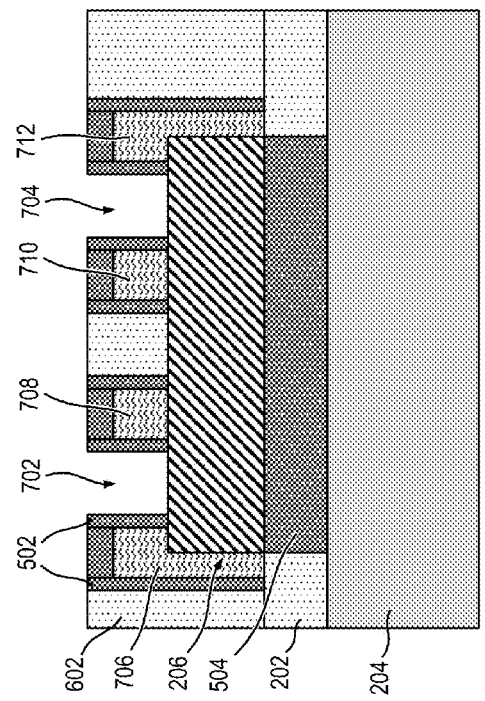
Figure 7A:
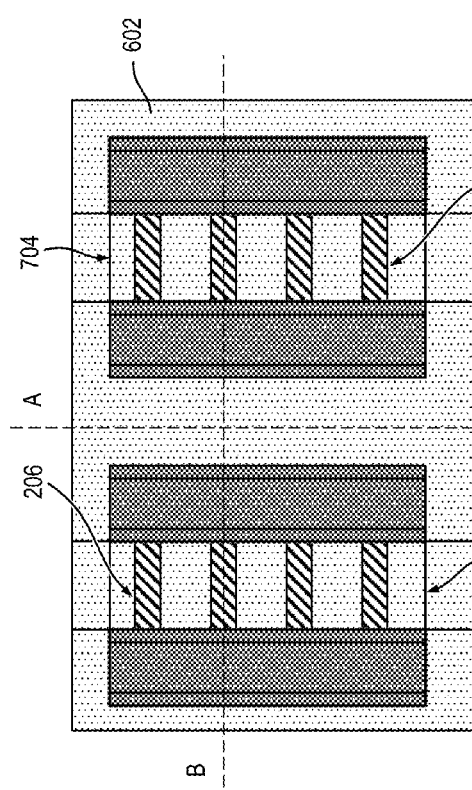
Figure 7B:
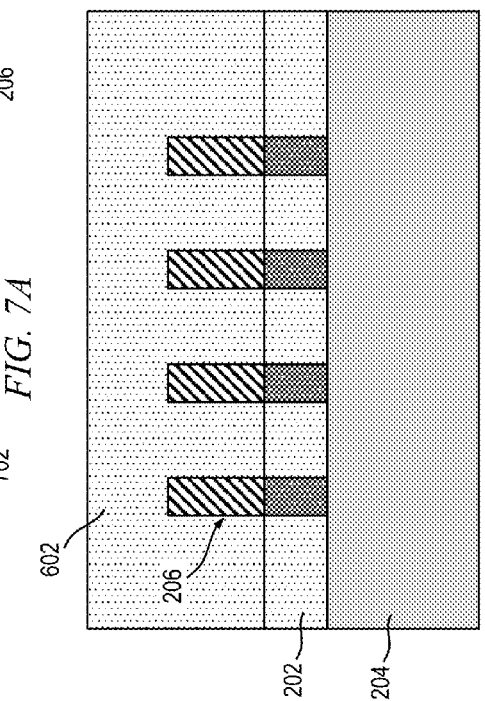

As shown in FIGS. 7A-7C, one exposure of a contact mask is used, followed by etching (e.g., wet or dry etching), to form corresponding openings 702 and 704 (i.e., windows) through the dielectric layer 602 between select dummy gates, above a source or drain of an active device. FIG. 7A is a top plan view and FIGS. 7B and 7C are corresponding cross-sectional views taken at lines A and B, respectively, in FIG. 7A. The openings are preferably formed using standard lithographic patterning and etching, as will be known to those skilled in the art. In this illustrative embodiment, the openings are not formed over adjacent pairs of dummy gates; rather, adjacent openings 702, 704 are separated by at least one pair of dummy gates. More particularly, opening 702 is formed between dummy gates 706 and 708, and opening 704 is formed between dummy gates 710 and 712, with the dielectric layer 602 between gates 708 and 710 left intact.

In one or more embodiments, reactive ion etching (RIE) is used to selectively form the openings 702, 704 through the dielectric layer 602, although embodiments of the invention are not limited to RIE. In performing the etching, the material (e.g., SiGe) forming the fins 206 is used as an etch stop layer. The openings 702, 704 expose at least a portion of the upper surface of the fins 206, as can be seen in FIG. 7A.

Figure 8A:
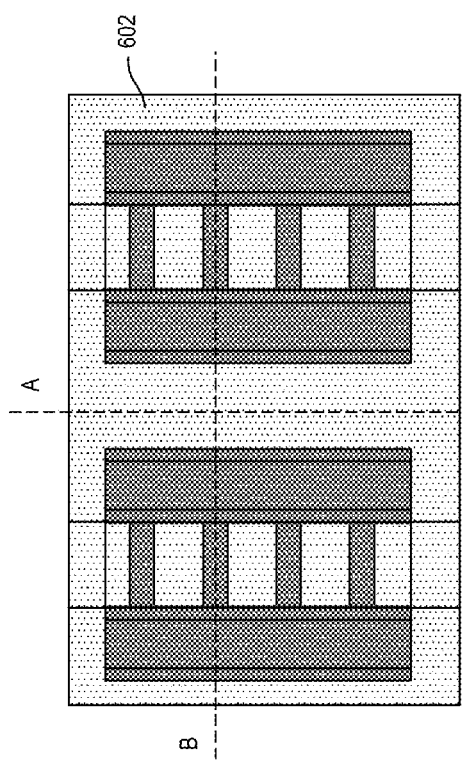
Figure 8C:
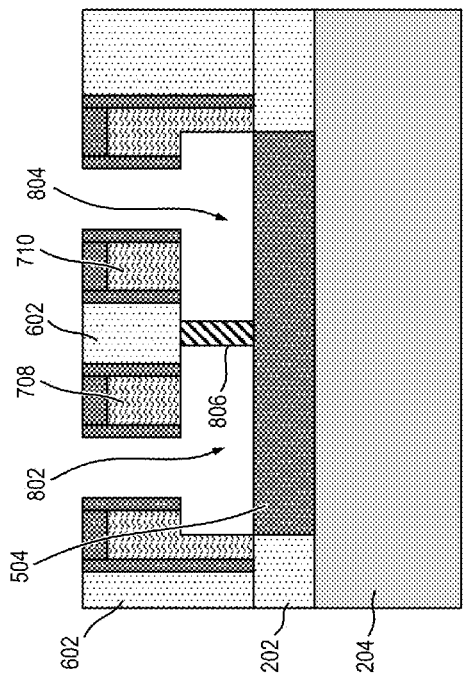
Figure 8B:
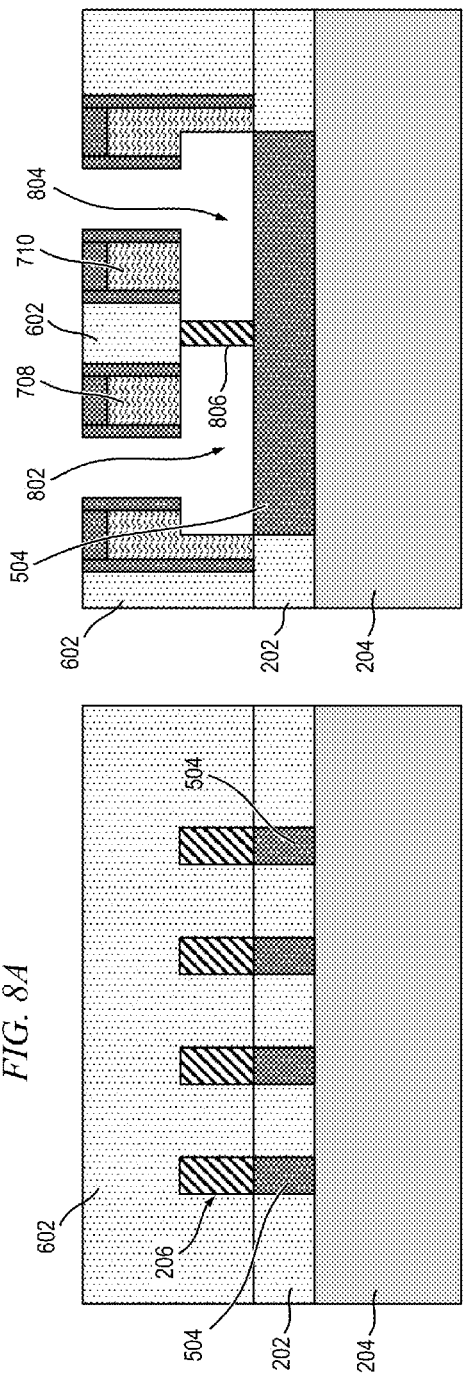

Next, an isotropic etch is performed using an etchant to etch the fins 206, such as, for example, using xenon difluoride ($XeF_2$) gases or other isotropic wet or dry etch which is selective to materials not used in forming the fins 206, as depicted in FIGS. 8A-8C; FIG. 8A is a top plan view and FIGS. 8B and 8C are corresponding cross-sectional views taken at lines A and B, respectively, in FIG. 8A. Referring to FIGS. 8A-8C, the etching step is conducted in a manner which results in the formation of voids 802 and 804, leaving a seed 806 under an unexposed portion of the dielectric layer 602; that is, under the remaining portion of the dielectric layer 602 between dummy gates 708 and 710. The etching takes place concurrently through both openings 702, 704 and proceeds horizontally, essentially tunneling, leaving an unetched portion of the fins 206 remaining separating the voids 802, 804. Thus, the seed 806, in one or more embodiments, comprises the same semiconductor material (SiGe) used to form the fins 206. A thickness of the seed 806 will be dependent on a timing of the etch; the longer the duration of the etch, the thinner the seed. The portion of the fin material remaining is referred to as a "seed" primarily because it will be used in a subsequent processing step to grow the channel material used in forming an active device.

With reference now to FIGS. 9A-9D, where FIG. 9A is a top plan view and FIGS. 9B, 9C and 9D are corresponding cross-sectional views taken at lines A, B and C, respectively, in FIG. 9A, a second semiconductor material layer 902 (e.g., indium gallium arsenide (InGaAs), indium arsenide (InAs), or the like) is grown on an upper surface of the fins 206, substantially filling the voids 802, 804 (FIG. 8C), according to one or more embodiments. The growth process should be performed in an epitaxial manner, using a method such as, but not limited to, MOCVD described in conjunction with FIG. 1. In other embodiments, the semiconductor material layer 902 can be formed on the fins 206 using an alternative process. The semiconductor material layer 902 is grown from the seed material 806 and forms the channel material of the active device.

The second semiconductor material layer 902 is grown, in one or more embodiments, using an epitaxy process (e.g., metal-organic CVD). In one or embodiments, the seed 806 comprises SiGe, which is a Group IV material, and the second semiconductor material layer 902 comprises Group III-V material. It is to be appreciated, however, that the second semiconductor material layer 902, in other embodiments, may comprise other materials, such as, for example, Group IV or Group II-VI materials or carbon-based semiconductor materials. Thus, stated more broadly, the seed 806 comprises a first crystalline semiconductor material and the second semiconductor material layer 902 comprises a second crystalline semiconductor material that is different from the seed material. The type of material(s) forming the second semiconductor material layer 902 will depend upon certain process characteristics, including the source of the growth (e.g., gases, etc.).

FIGS. 10A-10D shows redepositing a dielectric material and replanarizing the wafer; FIG. 10A is a top plan view and FIGS. 10B, 10C and 10D are corresponding cross-sectional views taken at lines A, B and C, respectively, in FIG. 10A. More particularly, consistent with the replanarizing process previously described in connection with FIGS. 6A-6C, in replanarizing the wafer according to one or more embodiments, a dielectric layer 1002 (e.g., silicon dioxide) is grown over at least a portion of an upper surface of the semiconductor structure (e.g., over the fins 206, hardmask layer 304, etc.), thereby filling any voids, such as the openings 702, 704 (FIG. 7C) between dummy gates, followed by CMP or an alternative polishing/planarizing process.

Figure 11A:
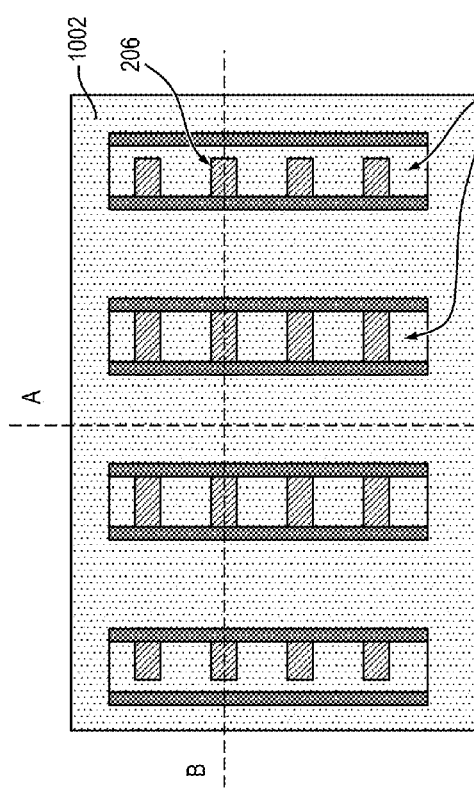
Figure 11C:
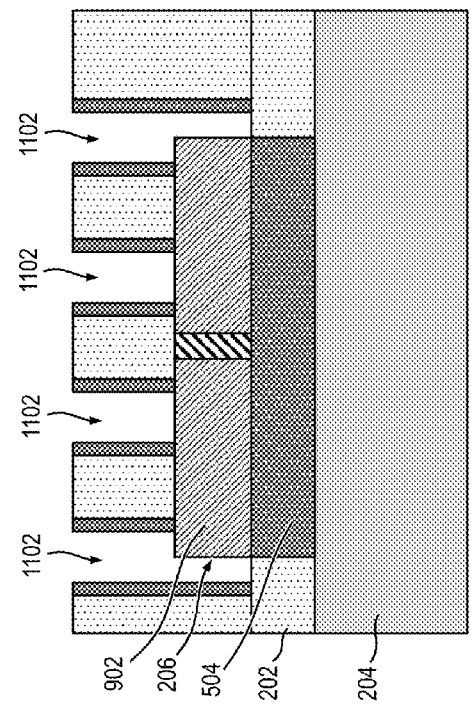
Figure 11B:
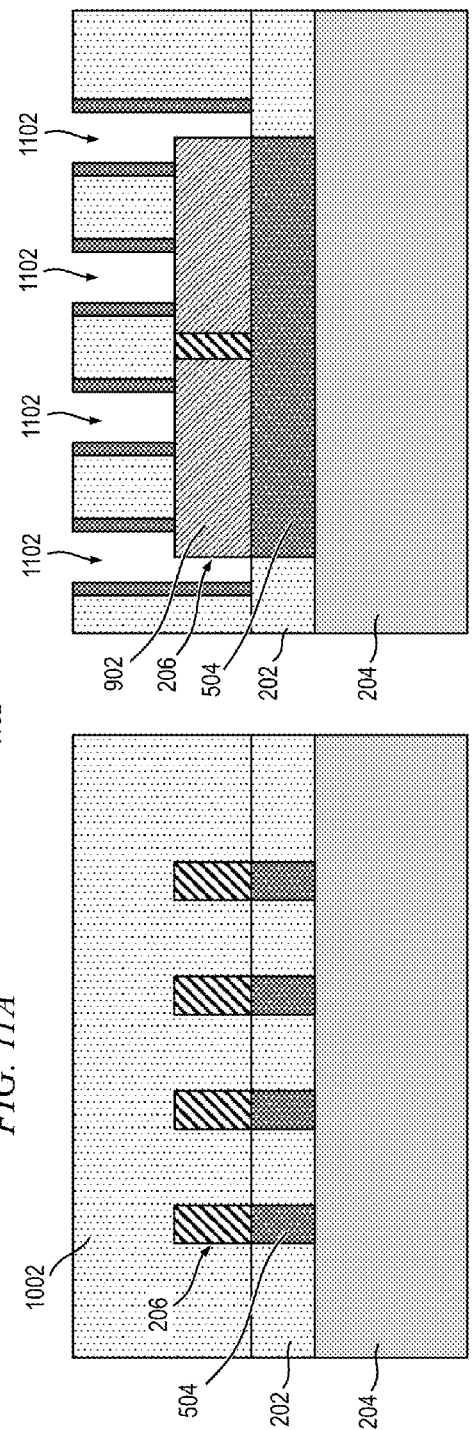

FIGS. 11A-11C depict the removal of the dummy gate structures, according to an embodiment of the invention; FIG. 11A is a top plan view and FIGS. 11B and 11C are corresponding cross-sectional views taken at lines A and B, respectively, in FIG. 11A. Here, each of the dummy gate structures comprises the hardmask 304, the dummy gate 302 and the dummy gate oxide (which is not explicitly shown, but is implied) between the dummy gate and the dielectric layer 202. Thus, in one or more embodiments, removal of the dummy gate structures involves removing the hardmask layer 304, followed by removal of the dummy gates 302 themselves, followed by gate oxide removal. The removal of the various dummy gate structure components, in one or more embodiments, involves wet or dry etching using different etchants selective to the material that is to remain (i.e., material that should not be removed). For example, in one or more embodiments, removal of the dummy gates 302 is achieved by wet etching using an etchant that is selective to the material not forming the dummy gates, although alternative gate removal methods are similarly contemplated (e.g., reactive ion etching (RIE)). After removal of the dummy gates, a plurality of openings 1102 are formed, with the insulating spacers 502 (FIG. 5C) remaining on the sidewalls of the openings 1102.

In the context of forming an active semiconductor device including a nanowire channel, at least a portion of dielectric material (e.g., dielectric regions 504) under the second semiconductor material layer 902 forming an upper portion of each of the fins 206 is removed, in one or more embodiments, and gate material is placed under the fin to form a nanowire. In this illustrative embodiment, the top part of the dielectric regions 504 will be removed so a gate dielectric and gate metal can be deposited and surround the second semiconductor material layer 902 of the fins 206.

Figure 12C:
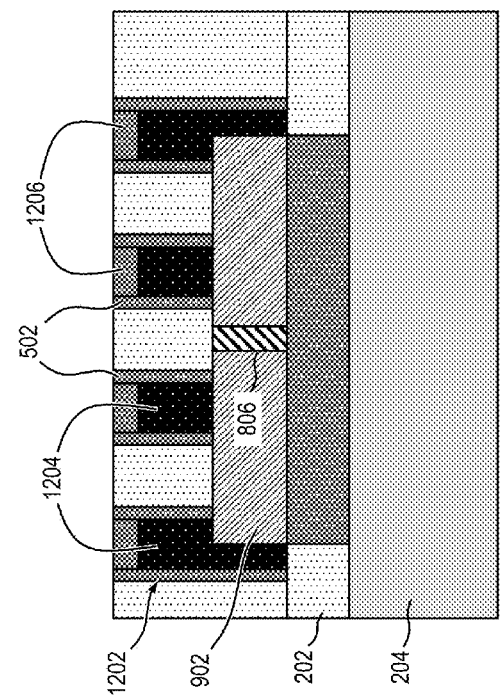
Figure 12A:
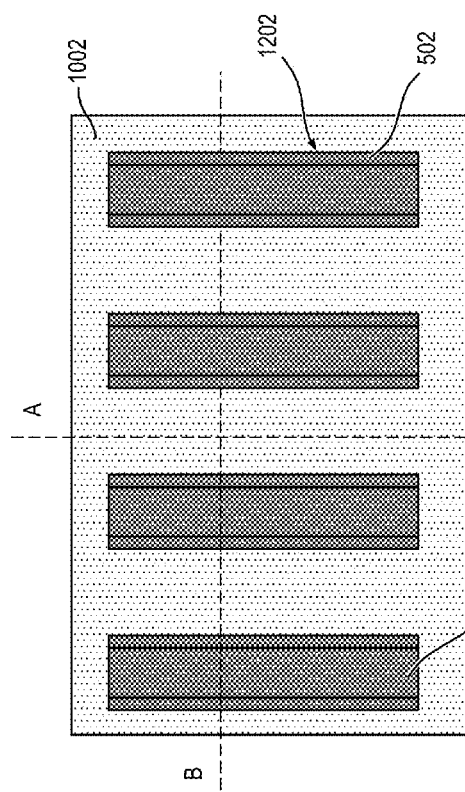
Figure 12B:
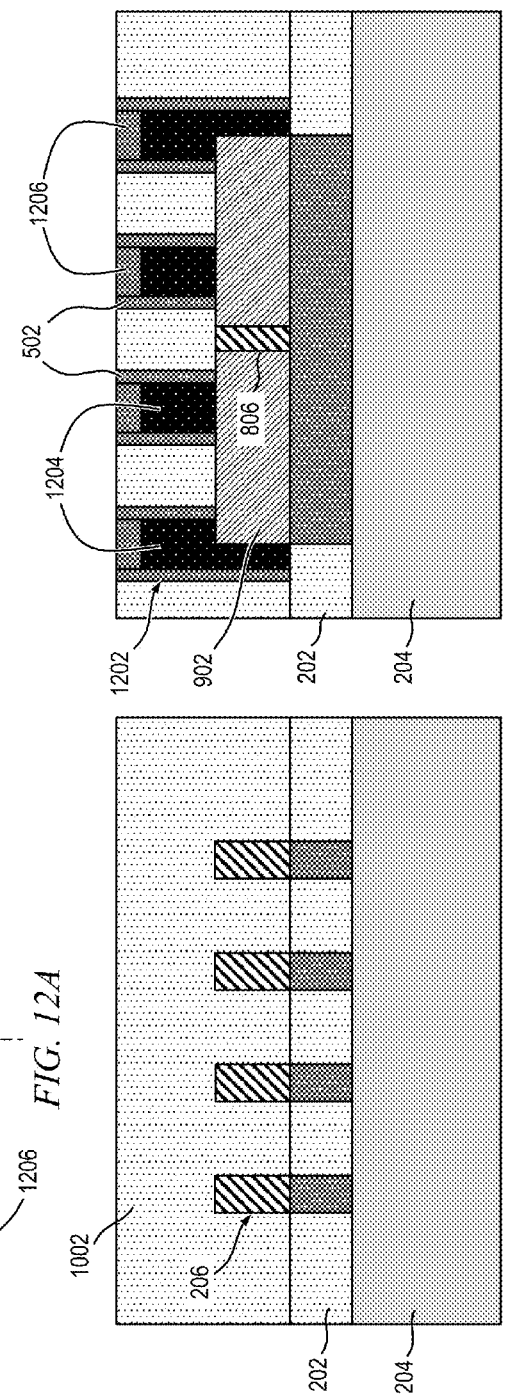

FIGS. 12A-12C depict the replacement of the dummy gates 302 (FIG. 10C) with real gate structures 1202, according to one or more embodiments; FIG. 12A is a top plan view and FIGS. 12B and 12C are corresponding cross-sectional views taken along lines A and B, respectively, in FIG. 12A. Specifically, with reference to FIGS. 12A and 12C, the gate structures 1202 are formed as stacks, wherein the openings 1102 shown in FIG. 11C are filled with gate material 1204, such as, for example, by a deposition process.

In this illustrative embodiment, like the dummy gate embodiment shown in FIG. 10C, the real gate structure comprises multiple components; namely, a thin gate dielectric (i.e., gate oxide) formed on the upper surface of the dielectric layer 202 in the bottom of the openings 1102, which may comprise a high-K material (not explicitly shown but implied), real gate material 1204, and a hardmask layer 1206 formed on an upper surface of the real gate which serves as a capping layer. In one or more embodiments, the gate material 1204 comprises a metal (e.g., high work function metal). Each of the real gate components is preferably formed using a known deposition process, followed by multiple planarization steps. For example, in one or more embodiments, the gate oxide layer (not explicitly shown but implied) is deposited in the openings (1102 in FIG. 11C) and the gate material 1204 is deposited on the gate oxide filling the openings. A CMP process is performed to planarize the gate material layer 1204, followed by a recess step (e.g., wet etch). Then, the hardmask layer 1206 is deposited on the gate material 1204, followed by another CMP step to planarize the real gate structure 1202. As will become apparent to those skilled in the art given the teachings herein, for the PFET device, a similar methodology is used to replace the dummy gates with real gate structures (e.g., replacement metal gate (RMG) process). The specific steps of a PFET RMG process are not explicitly shown in the figures but are implied, as the RMG process is well-known in the art.

Next, the dielectric layer 1002 is removed, as depicted in FIGS. 13A-13C; FIG. 13A is a top plan view and FIGS. 13B and 13C are corresponding cross-sectional views taken along lines A and B, respectively, in FIG. 13A, according to an embodiment of the invention. The seed 806 (FIG. 12C) is also removed. As shown in FIGS. 13A and 13B, a thin section of the upper portion (SiGe portion 206) of the fins 902 is removed to form openings 1302 through the semiconductor material layer 902 to thereby expose the underlying insulating material 504.

Reference is now made to FIGS. 14A-14C, where FIG. 14A is a top plan view and FIGS. 14B and 14C are corresponding cross-sectional views taken along lines A and B, respectively, in FIG. 14A, according to an embodiment of the invention. In FIGS. 14A-14C, Group III-V regions 1402 are formed on at least a portion of an upper surface of the dielectric layer 202 and between the gates 1202 and encapsulate the semiconductor material layer 902. Group III-V regions 1402 also fill in the openings 1302 formed in between the fins 902. The Group III-V regions 1402 are electrically isolated from the gate material 1204 by the insulating sidewall spacers 502. In one or more embodiments, the Group III-V regions 1402 are formed by an epitaxial deposition process and doped with an impurity of a prescribed conductivity type and doping concentration level to thereby form source and drain regions of the active semiconductor device. For example, in the case of an illustrative NFET device, the source and drain regions are doped with an N-type dopant (e.g., silicon), and for an illustrative PFET device, the source and drain regions are doped with a P-type dopant (e.g., Zn), as will be known by those skilled in the art.

An anneal step is then performed, whereby the source and drain dopants diffuse into the surrounding semiconductor material layer 902, which forms Group III-V source and drain regions of the active semiconductor (e.g., NFET or PFET) device, as shown in FIGS. 15A-15C; FIG. 15A is a top plan view and FIGS. 15B and 15C are corresponding cross-sectional views taken along lines A and B, respectively, in FIG. 15A, according to an embodiment of the invention. In one or more embodiments, the anneal process is performed at a temperature of about 600° C. for a prescribed duration (e.g., about 1 millisecond (ms) to 30 minutes), although embodiments of the invention are not limited to this particular temperature and/or duration for the anneal.

Figure 16A:
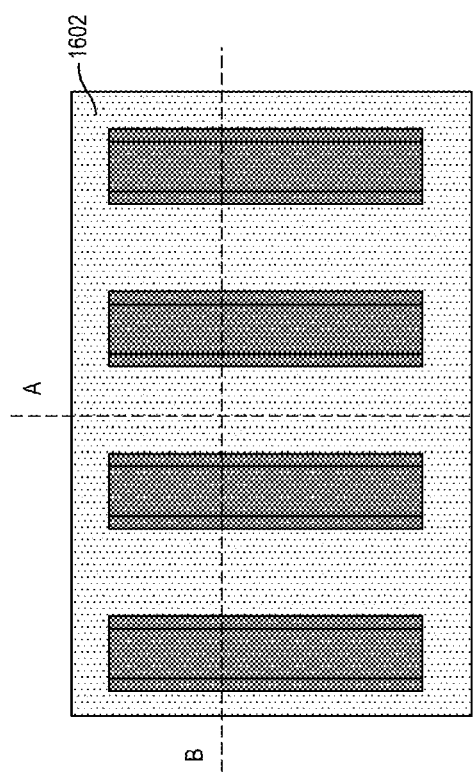
Figure 16C:
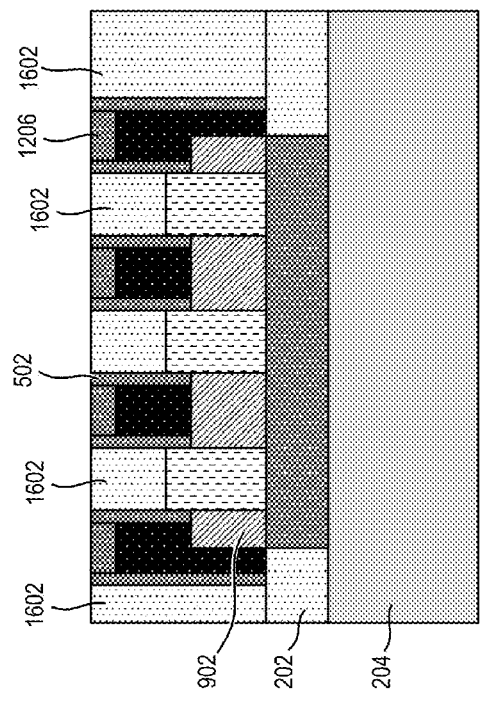
Figure 16B:
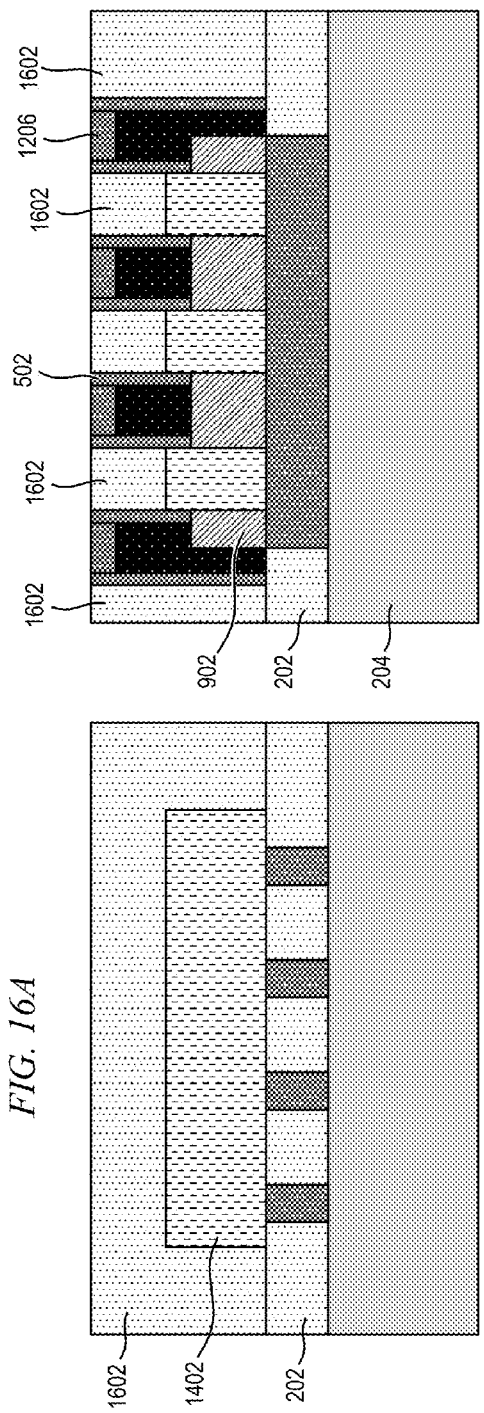

In FIGS. 16A-16C, a contact dielectric layer 1602 is redeposited over at least a portion of the upper surface of the semiconductor structure; FIG. 16A is a top plan view and FIGS. 16B and 16C are corresponding cross-sectional views taken along lines A and B, respectively, in FIG. 16A, according to an embodiment of the invention. The contact dielectric layer 1602 is then replanarized, such as by using CMP or an alternative planarization process, followed by contact and back-end metallization to form contacts of the active semiconductor devices. Dielectric layer 1602 can also be optional, in one or more embodiments, and the contact metallization can be performed directly on the opening above the Group III-V regions 1402.

Given the discussion thus far, it will be appreciated that, in general terms, an exemplary method of forming an active device on a semiconductor wafer includes the steps of: forming a plurality of semiconductor fins on at least a portion of a semiconductor substrate; forming a dielectric layer on at least a portion of the semiconductor substrate, the dielectric layer filling gaps between adjacent fins; forming a plurality of gate structures on an upper surface of the dielectric layer; forming a channel region on the dielectric layer and under at least a portion of the gate structures, the channel region comprising a first crystalline semiconductor material; forming source and drain epitaxy regions on an upper surface of the dielectric layer and between adjacent gate structures, the source and rain regions being spaced laterally from one another; and replacing the channel region with a second crystalline semiconductor material after high-temperature processing used in fabricating the active device has been completed.

Given the discussion thus far, it will also be understood that an exemplary method of forming a Group III-V channel, or other semiconductor channel, in an active device (e.g., an NFET) is provided. The Group III-V channel is formed after a replacement gate process so as to allow other silicon devices (e.g., a PFET) to conduct high temperature source or drain processes without impacting the Group III-V device.

Given the discussion thus far, it will be further appreciated that an exemplary semiconductor device, such as, for example, an NFET or PFET device, is formed in accordance with the exemplary methods described herein. The semiconductor device includes, in one or embodiments, includes a horizontally-oriented Group III-V nanowire channel which is fabricated after performing high-temperature process steps.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having active semiconductor devices therein formed in accordance with one or more embodiments of the invention.

An integrated circuit in accordance with aspects of the present disclosure can be employed in essentially any application and/or electronic system where semiconductor structures are employed. Suitable systems and devices for implementing embodiments of the invention may include, but are not limited to, microprocessors for high-end servers, portable electronics, etc. Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. §1.72 (b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. An active semiconductor device, comprising:
    a plurality of semiconductor fins formed on at least a portion of a semiconductor substrate;
    a first dielectric layer formed on at least a portion of an upper surface of the semiconductor substrate, the first dielectric layer filling gaps between adjacent fins;
    a plurality of gate structures formed on an upper surface of the first dielectric layer;
    a channel region formed on the upper surface of the first dielectric layer and under at least a portion of the gate structures, the channel region comprising a first crystalline semiconductor material, the channel region further comprising a second crystalline semiconductor material formed on at least a portion of the upper surface of the first dielectric layer and between the gate structures, the second crystalline semiconductor material encapsulating the first crystalline semiconductor material and filling openings formed between the fins, the channel region being channel region being formed after high-temperature processing used in fabricating the active semiconductor device has been completed; and
    source and drain regions formed on the upper surface of the first dielectric layer and between adjacent gate structures, the source and rain regions being spaced laterally from one another.

2. The device of claim 1, further comprising a second dielectric layer formed over at least a portion of an upper surface of said semiconductor device, an upper surface of the second dielectric layer being planarized to a height of an upper surface of said gate structures.

3. The device of claim 1, wherein the second crystalline semiconductor material comprises a horizontally grown nanowire structure.

4. The device of claim 1, wherein the second crystalline semiconductor material comprises a Group III-V material.

5. The device of claim 1, further comprising insulating spacers formed on at least a portion of sidewalls of said gate structures, the insulating spacers electrically isolating the gate structures from the second crystalline semiconductor material.

6. The device of claim 1, wherein each of at least a subset of said plurality of gate structures comprises a metal.

7. The device of claim 1, wherein said first and second crystalline semiconductor materials are different relative to one another.

* * * * *